United States Patent [19]
Sharpe-Geisler et al.

[11] Patent Number: 5,751,164
[45] Date of Patent: May 12, 1998

[54] PROGRAMMABLE LOGIC DEVICE WITH MULTI-LEVEL POWER CONTROL

[75] Inventors: Bradley A. Sharpe-Geisler, San Jose; Bryon I. Moyer, Cupertino, both of Calif.

[73] Assignee: Advanced Micro Devices, Inc., Sunnyvale, Calif.

[21] Appl. No.: 668,896

[22] Filed: Jun. 24, 1996

[51] Int. Cl.$^6$ .................................................. H03K 17/14
[52] U.S. Cl. .............................. 326/38; 326/33; 327/544
[58] Field of Search ..................................... 364/490–491; 326/21, 33, 37–39; 327/544

[56] References Cited

U.S. PATENT DOCUMENTS

| | | | |
|---|---|---|---|
| 5,521,527 | 5/1996 | Sakata et al. | 326/21 |
| 5,563,527 | 10/1996 | Diba | 326/41 X |
| 5,563,928 | 10/1996 | Rostoker et al. | 327/513 X |
| 5,565,791 | 10/1996 | Raza | 326/38 |
| 5,585,745 | 12/1996 | Simmons et al. | 327/544 X |

*Primary Examiner*—David R. Hudspeth
*Attorney, Agent, or Firm*—Skjerven, Morrill, MacPherson, Franklin, & Friel, LLP; Forrest E. Gunnison

[57] ABSTRACT

For each programmable logic block in a programmable logic device, a programmable power and speed control circuit is programmably configurable to generate an output signal on a power and speed control line so that the static power consumption of the corresponding programmable logic block is adjusted to provide a particular combination of power and speed for that programmable logic block, i.e., a specific power/speed performance point. For each programmable logic block in the programmable logic device, a plurality of programmable selectable speed/power levels are provided by the programmable power and speed control circuit. This allows a distribution of programmable logic blocks in the programmable logic device that are powered to various performance levels to match more closely a distribution of performance requirements by the circuit that includes the various programmable logic blocks.

11 Claims, 6 Drawing Sheets

PROGRAMMABLE LOGIC DEVICE WITH MULTI-LEVEL POWER CONTROL

BACKGROUND OF THE INVENTION

1. Field of the Invention

This invention relates generally to complex programmable logic devices and in particular to a method and structure used to control power consumption and speed performance in a complex programmable logic device.

2. Description of Related Art

Power consumption has grown as an issue for complex programmable logic devices (CPLDs) over the last several years. Simple PAL devices that used bipolar technology consumed about one watt of power. (PAL is a registered U.S. Trademark of Advanced Micro Devices of Sunnyvale, Calif.). This technology was rendered obsolete by complementary metal-oxide-semiconductor (CMOS) technology, which provided comparable performance with one-half or less the power consumption. This firmly established power consumption as an issue for PLDs.

The issue of power consumption is one factor that has forestalled the development of arbitrarily large CPLDs, since that would result in arbitrarily high power consumption. This is in contrast to so-called field-programmable gate arrays (FPGAs), whose power consumption has much less dependence on density. This can give FPGAs a competitive advantage over CPLDs in certain applications.

CMOS technology has the characteristic that if no signals are changing, no appreciable power is consumed for true digital circuits. The power consumed is proportional to the number of signals switching, and the rate at which the signals switch. As more signals switch, more power is consumed. As signals switch at higher frequencies, more power is consumed. Power consumption associated with signal switching in CMOS circuitry is referred to as dynamic power consumption.

CPLDs use digital CMOS technology for most portions of the circuitry, but there are some critical analog CMOS circuits that consume power even when no signals are switching. This component of power consumption is referred to as static power consumption. Thus, the total power consumption of a CPLD is made up of two components: a static component from the analog circuits, and a dynamic component from the digital circuits.

Since FPGAs use only digital CMOS technology, FPGAs have only a dynamic power consumption component. While this component is comparable to the dynamic power consumption of a CPLD, the static component of the CPLD power raises the CPLD power consumption considerably when compared to an FPGA or other CMOS standard logic. Consequently, CPLDs are at a competitive disadvantage to FPGAs when power consumption is an important factor.

Also, power consumption is ultimately manifested as heat given off by the CPLD. This heat is generated in the silicon, and is transferred to the ambient environment through the package of the CPLD. The actual temperature of the silicon is determined by the temperature of the ambient environment and the ability of the package to draw heat away from the silicon into the ambient environment. This characteristic of the package is referred to as the thermal impedance of the package. The higher the thermal impedance of the package, the harder it is for heat generated inside the silicon to get out into the ambient environment. If heat cannot escape, the temperature of the silicon rises.

If the silicon temperature rises beyond a predetermined maximum temperature, referred to as the maximum junction temperature $T_{Jmax}$, the silicon device cannot be guaranteed to perform according to specifications, and reliability can be threatened. In extreme cases, the characteristics of the package can change, and the device can be permanently damaged.

Chip designers therefore must take into account how much heat a circuit generates in the intended packaging to ensure that the chip operates within acceptable temperature bounds. As explained above, the static component of CMOS power consumption is fixed. As the size of CPLD is increased, the power consumption raises in direct proportion to the density due to the static component. This has limited the size of CPLDs that can be built.

Nevertheless, to provide the kind of speed that users demand of CPLDs, power must be consumed. This is the classical tradeoff of speed versus power. Older generation prior-art CPLDs and PAL devices were generally available in different versions from a single technology: faster devices that consumed more power, and slower devices that consumed less power.

This led to a proliferation of devices that became more difficult to manage for the producer. As devices get larger, however, the decision of speed or power for a user is not so clear-cut. Typically, a circuit that lies in the critical path on a chip requires high speed. However, other circuits on the chip are able to tolerate slower performance, and could often benefit from less power consumption. A large CPLD may well encompass both of these kinds of circuits at the same time.

This non-uniformity of performance and power requirements on a CPLD raises the possibility of allowing the user to make power vs. speed selections. FIG. 1 is a block diagram of a logic structure 100 typically found in prior art CPLDs. A plurality of product terms 110 drive sensing and OR gate circuity. 120. Typically, the sensing circuitry was used to detect whether a product term should be interpreted as a logic zero or a logic one. The OR gate circuitry was used to generate a sum-of-product terms.

The output signal from sensing and OR gate circuity 120 drives a logic macrocell 130 and the output signal from logic macrocell 130 in turn drives a first feedback line 131 and an I/O cell 140. The output signal from I/O cell 140 drives I/O pin 150 and a second feedback line 151.

In some prior-art CPLDs with logic structure 100, a programmable power-down cell 260 (FIG. 2) was provided with each logic structure 100 to allow a trade-off between speed and power. Static power is predominantly dissipated in sensing circuitry and OR gate circuitry 120 between product terms 110 and macrocell 130. Thus, by configuring programmable power-down cell 260, each logic structure 100 was programmed either for higher speed or lower power consumption, but not both. See for example, "Obtaining 70 MHz performance in the MAX architecture," *Electronic Engineering*, FIG. 5, pg 69, 72, May 1991.

In other prior-art CPLDs, power was reducible on a per-macrocell basis, and if all of logic structures 100-1 to 100-n within a block 300 (FIG. 3) were in a low-power mode, further reducible at the block level. Specifically, if power-down bits to 260-1 to 260-n for OR circuitry 322-1 to 322-n, respectfully, were all in a logic one state, i.e., all of the macrocells were powered down, the output signal of AND gate 310 was a logic one. The logic one signal to sensing circuits 321-1 to 321-n resulted in a further reduction of the power consumed by sensing circuits 321-1 to 322-n.

All of these prior-art schemes to control power consumption of a PLD have the drawback that a selection circuit, i.e., a programmable power-down cell that requires a number of logic, reference, and programming circuits, is needed for each macrocell. This increases the die size which in turn reduces the economic competitiveness of the chip.

The number of macrocells controlled by a single power-down cell is defined as the granularity of power control. In the above prior-art examples, a maximum granularity of one power-down cell per macrocell was used.

To reduce silicon requirements of the power selection circuitry, the granularity of the power control must be reduced. For instance, one power-down cell per block could be used. The difficulty with this approach is that for the performance that most designs require, the power could not be reduced enough to be competitive with the high-granularity power control devices. If the power reduction were made larger, the speed in the power-down mode would not be adequate for many applications.

There is generally a distribution of speeds required on a circuit board. The fastest speeds are typically addressed by the high-power mode. The question remaining is, how many signals require high-power mode, and how much is the power reduced in the end?

One approach for the two level power control would be to power-down all but the highest speed signals. If few signals require a high-power mode for acceptable speed, more signals can be powered down, potentially lowering the overall power consumption of the chip. This approach requires that the speed of signals in the power-down mode has to be high enough to satisfy the requirements of all but the fastest signals. Unfortunately, this requirement limits the power reduction so that enough speed performance remains. Consequently, such an approach provides only a limited power reduction benefit.

If the power reduction in low-power mode is more substantial, the low-power mode speed performance suffers. In this case, more signals require high-power mode. So while the powered-down signals consume less power, there are fewer candidates for power-down. Since more signals require full power, the power reduction for the entire circuit is not appreciable.

This discussion is further impacted when power control is handled with block-level granularity, since the power level on an entire block is determined by the speed requirements of the fastest signal in the block. This further raises the actual power consumption of the complete circuit as to maintain a minimum acceptable speed performance.

SUMMARY OF THE INVENTION

According to the principles of this invention, in one embodiment, a complex programmable logic device has block-level power-down control with multiple power-down levels. This power-down control architecture eliminates the prior art die size penalties of fine-granularity power-down control, and the trade-off inefficiencies associated with block-level power-down control. The multiple power-down levels permit configurations that eliminate the necessity of trading speed performance for power savings. In particular, circuits having a common speed performance are placed in a block and a power-level commensurate with that speed performance is selected for that block. The multiple levels available make this possible in comparison to the prior-art two-level approach.

Providing multiple power levels at a block level granularity allows some signals in the CPLD to have extremely fast speeds, and some signals to be powered down far below what would be possible in the prior art two-level power-down methods including methods with fine granularity control. User implementations requiring low speed therefore operate at power consumption levels far below anything possible in prior-art CPLDs.

In one embodiment, each programmable logic structure includes a plurality of logic elements, and a power and speed performance control line coupled to each of the plurality of logic elements. A speed performance and a power consumption of the programmable logic structure are determined by a signal on the power and speed performance control line.

A programmable power and speed control circuit is coupled to the power and speed performance control line. The programmable power and speed control circuit is programmably configurable to provide a signal selected from one of at least three power and speed performance point signals on the power and speed performance control line. Specifically, in this embodiment, a plurality of programmable power/speed reference architectural cells are connected to the programmable power and speed control circuit. Upon programming the plurality of programmable power/speed reference architectural cells, the programmable power and speed control generates the signal on the power and speed performance control line.

BRIEF DESCRIPTION OF THE DRAWINGS

Herein, elements with the same reference numeral are the same or similar.

DETAILED DESCRIPTION OF THE INVENTION

According to the principles of this invention, the prior art die size penalties of fine-granularity power-down control, and the trade-off inefficiencies associated with block-level power-down control are eliminated by providing multiple power-down levels at a low-granularity level. The multiple power-down levels permit configurations that eliminate the necessity of trading speed performance for power savings. In particular, circuits having a common speed performance are placed in a block and a power-level commensurate with that speed performance is selected for that block.

For a CPLD 400 that includes a plurality of segments which in turn each include a plurality of programmable logic blocks 401-A to 401-D, each programmable logic block is coupled to a programmable power and speed control circuit 450-A to 450-D, respectively, by a power and speed control line 451-A to 451-D, respectively. The particular interconnect architecture, i.e., a segmented structure, and block structure of CPLD 400 are not essential features of this invention.

Further, as used herein, a block structure is not intended to limit the invention to a particular architecture. In view of this disclosure, the power control principles of this invention can be used with any-lower granularity grouping of signals, e.g., a grouping of logic elements that share a common programmable power and speed control circuit. Thus, herein, a block is any lower granularity group of signals where the signal speed is controlled by a signal on a power and speed control line from the common programmable power and speed control circuit.

Each programmable power and speed control circuit 450-i, where i =A, B, C, and D, is programmably configurable to generate on power and speed control line 451-i a signal that selects one of at least three power and speed performance points for programmable logic block 401-i, e.g., a plurality of power and speed performance points. As explained more completely below, in one embodiment, the signal is a reference voltage level that determines the power consumption of programmable logic block 401-i, and the speed performance of programmable logic block 401-i.

Thus, the power control granularity is at the programmable logic block level, but multiple power consumptions levels for each programmable logic block are available. This overcomes the limitations of the prior art methods by allowing selection of a specific power/speed performance point, as explained more completely below, that is optimal for programmable logic block 401-i.

Figure 1:
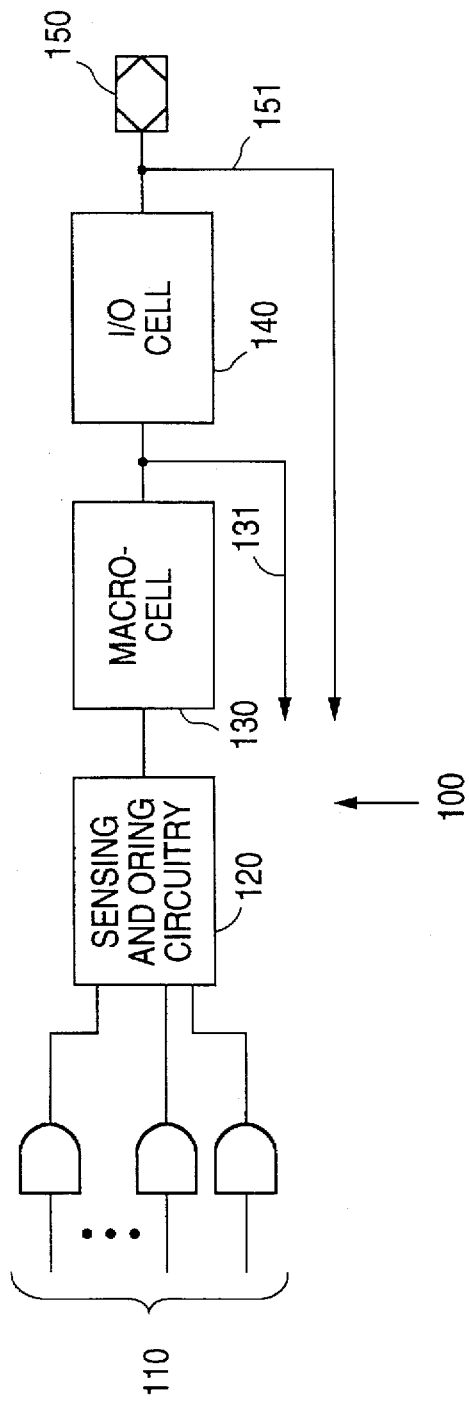
FIG. 1 is a block diagram of a prior art cell structure used in a programmable logic device.
Figure 2:
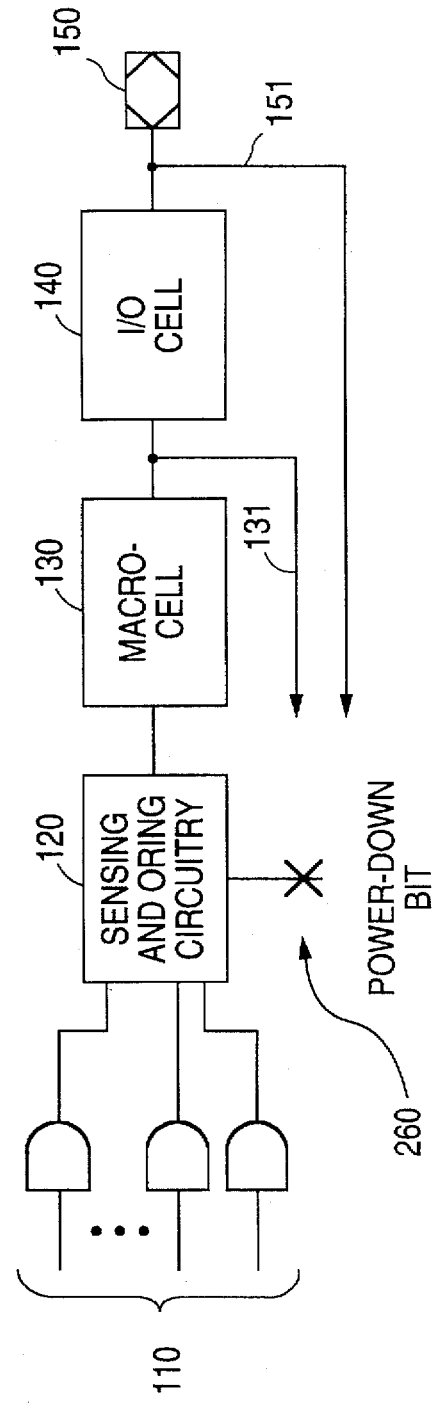
FIG. 2 is an illustration of the prior art cell structure with a cell level power-down granularity.
Figure 3:
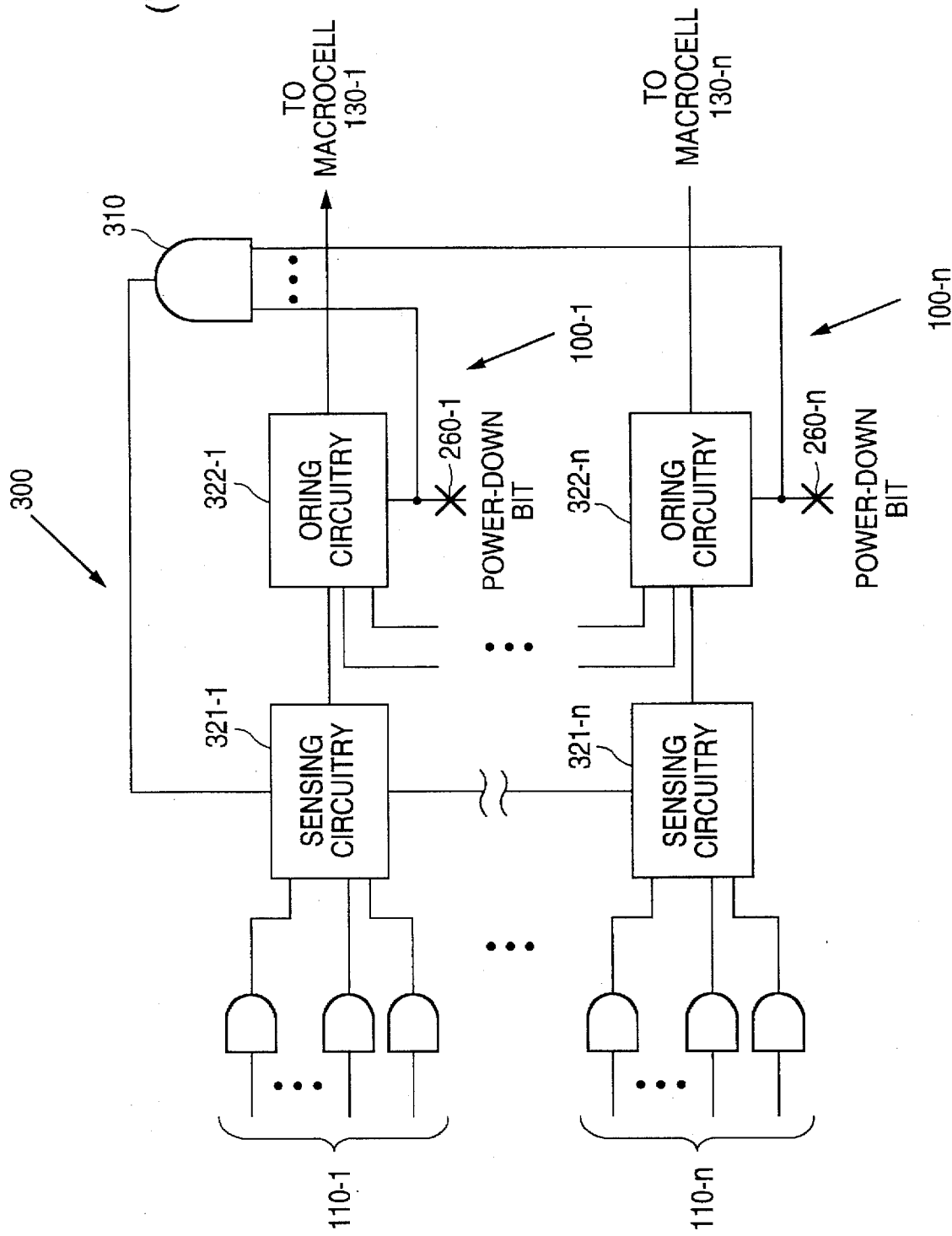
FIG. 3 is an illustration of a programmable logic block built using the prior art cell-level power-down structure with a supplemental block-level power-down.
Figure 4:
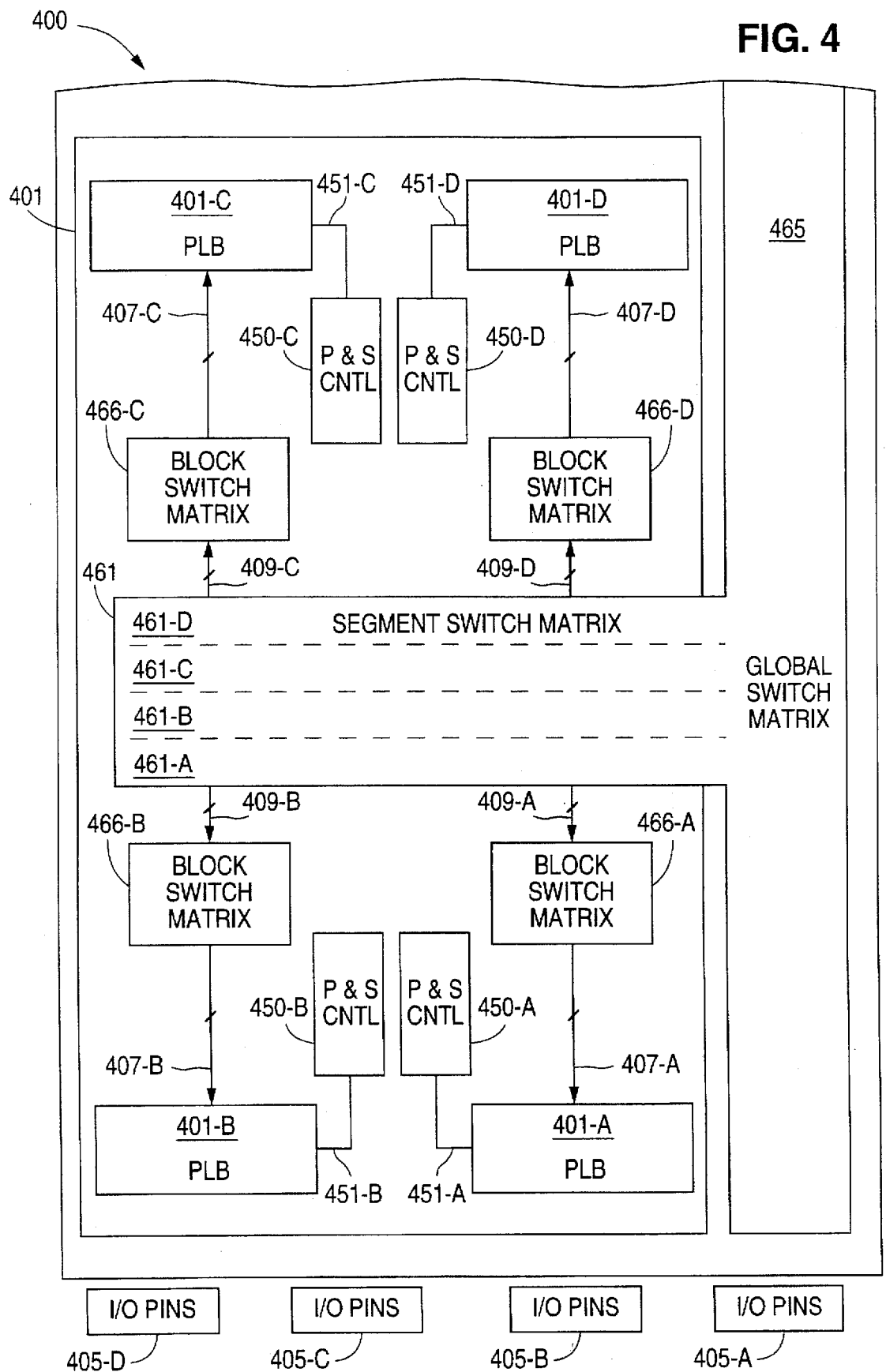
FIG. 4 is an illustration of a segment of a complex programmable logic device with a multi-power level block power-down granularity of this invention.

Specifically, FIG. 4 is an illustration of one segment 101 that in addition to programmable logic blocks 401-A to 401-D includes a plurality of block switch matrices 466A to 466D, where each block switch matrix couples a programmable logic block to a segment switch matrix 461. Segment switch matrix couples global switch matrix 465 to the plurality of block switch matrices 466A to 466D. A more detailed description of CPLD 400 is provided in U.S. Pat. No. 5,521,529 entitled "VERY HIGH-DENSITY COMPLEX PROGRAMMABLE LOGIC DEVICES WITH A MULTI-TIERED HIERARCHICAL SWITCH MATRIX AND OPTIMIZED FLEXIBLE LOGIC ALLOCATION" of Om P. Agrawal et al. issued on May 28, 1996, which is incorporated herein by reference in its entirety.

For each programmable logic block 401-i, programmable power and speed control circuit 450-i is programmably configurable to generate an output signal on power and speed control line 451-i so that the static power consumption of the corresponding programmable logic block 401-i is adjusted to provide a particular combination of power and speed for that programmable logic block, i.e., a specific power/speed performance point. Thus, for each programmable logic block 401-i in CPLD 400, a plurality of programmable selectable speed/power levels are provided by programmable power and speed control circuit 450-i.

This allows a distribution of programmable logic blocks in CPLD 400 that are powered to various performance levels to match more closely a distribution of performance requirements by the circuit that includes the various programmable logic blocks. Thus, in contrast to the prior art systems with a high granularity power control that allowed only a choice between two power and speed performance points, the CPLD of this invention has enhanced speed performance and reduced power consumption because the power consumption is selected to provide the desired speed performance for a particular block.

Figure 5:
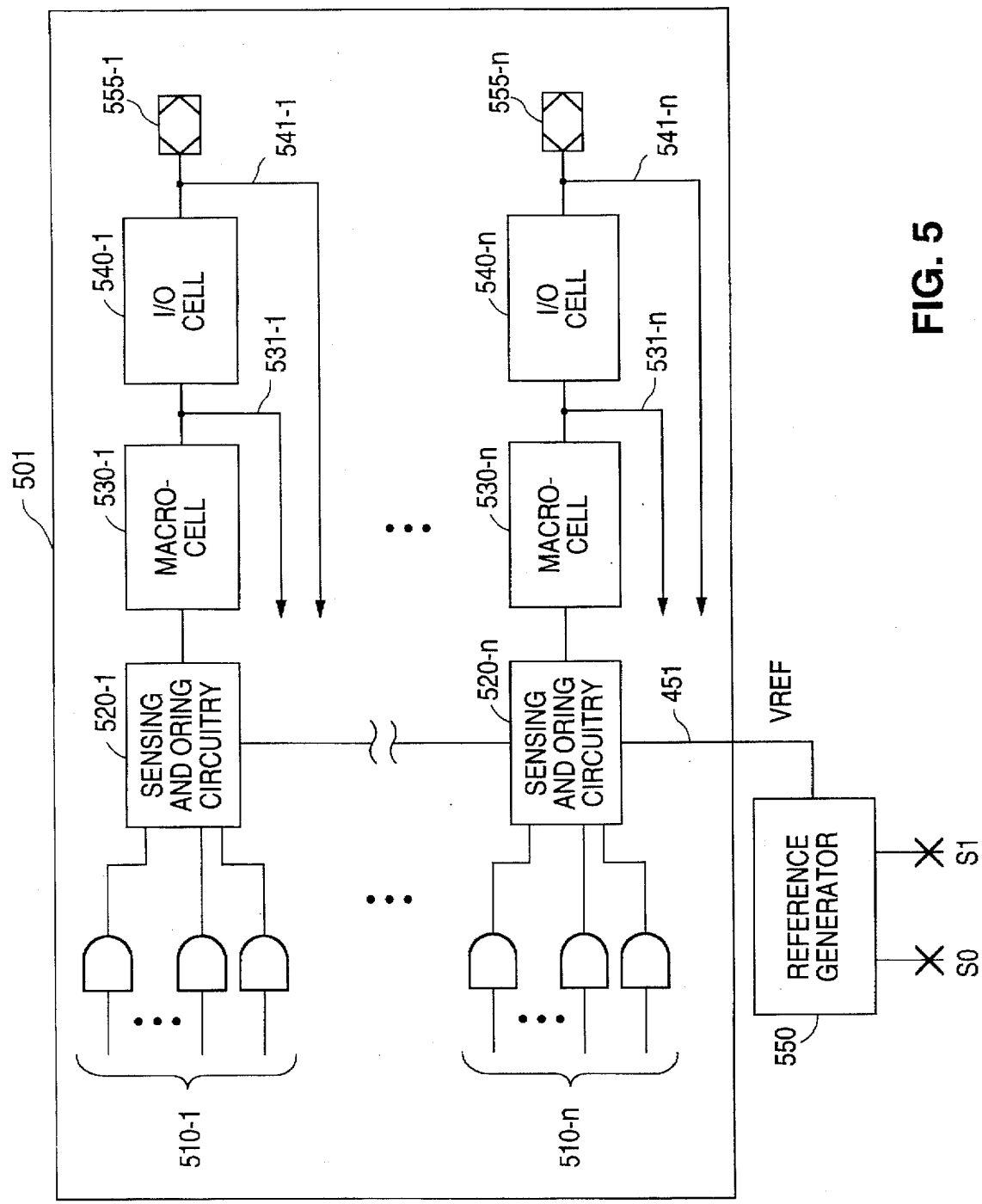
FIG. 5 is a more detailed illustration of one programmable logic block of the CPLD of FIG. 4 that is illustrates the novel power-down structure of this invention.

Since each programmable logic block 401-i in CPLD 400 has the same configuration, the principles of this invention are demonstrated for one embodiment using programmable logic block 501 (FIG. 5) that includes a plurality of product terms 510-1 to 510-n and each product term 510-1 to 510-n drives one of sensing and OR circuitry 520-1 to 520-n, i.e., drives a group of logic elements, respectively.

A sum of product terms from sensing and OR circuitry 520-i drives a logic macrocell 530-i that in turn drives a feedback line 531-i and an I/O output cell 540-i. I/O output cell 540-i is connected to another feedback line 541-i and an I/O pin 555-i. The particular configuration of the programmable AND array, sensing and OR circuitry 520-i, macrocell 530-i, and I/O cell 540-i are not essential to this invention, because the principles of this invention apply to any programmable logic device with a programmable block structure that includes a plurality of logic elements coupled to a common power and speed control line.

In this embodiment, power and speed control circuit 450-i is a programmable reference voltage generator circuit 550. In one implementation of programmable reference voltage generator circuit 550, a reference voltage controlling the drive capability of internal transistors in programmable logic block 501 is programmably adjusted to select one of at least three different power/speed points. Programmable reference voltage generator 550 is connected to a reference voltage line 551 that in turn is connected to each of sensing and OR circuitry 520-1 to 520-n.

Programmable reference voltage generator 550, as explained below, is programmably configured using programmable power/speed reference architectural cells S0 and S1 to provide a voltage level VREF on reference voltage line 551, where voltage level VREF is one of at least three reference voltage levels. For each reference voltage level VREF, programmable logic block 501 has a different speed performance and power consumption. Herein, speed performance is measured in terms of signal delay time. As the power consumption decreases, the signal delay time increases and conversely.

Table 1 is one example of the different power/speed points for the possible configurations of programmable power/speed reference architectural cells S0 and S1.

TABLE 1

| Power/Speed Points for Reference Voltage Generator Circuit 550 | | | | |
|---|---|---|---|---|
| S0 | S1 | Vref (Volts) | Speed | Power |
| 0 | 0 High | 1.2 | Fast 1 | High 1 |
| 0 | 1 Med Hi | 1.09 | Med Fast 1.3 | Med Hi 0.6 |
| 1 | 0 Med Lo | 1.02 | Med Slow 1.6 | Low 0.4 |
| 1 | 1 Low | 0.92 | Slow 2 | Ultra-low 0.2 |

In Table 1, columns S0 and S1 represent the state of architectural cells S0 and S1 respectively. Column Vref is the reference voltage level Vref generated by reference voltage generator circuit 550 for the particular combination of states of architectural cells S0 and S1 given and the typical levels of reference voltage level Vref in volts. Columns speed and power give the relative speed/power point for the programmable logic block for the reference voltage Vref.

In the first row of Table 1, reference voltage Vref has a high value of 1.2 volts. The levels of the speed and power for this reference voltage are taken as high and so are represented by a one, i.e, a maximum, in the speed and power columns. In the second row of Table 1, a medium high reference voltage level is 1.09 volts and a medium fast speed is a time delay that is 1.3 times the delay for the fast speed. A medium high power level is 0.6 of the high power level. The numbers in the remaining rows of Table 1 are interpreted in a similar fashion.

In the particular embodiment in Table 1, a transistor threshold voltage (VT) of 0.7 volts was used in defining the various reference voltage levels. For a different semiconductor technology with a different transistor threshold voltage level, the relative relationships between the rows in Table 1 could be different. Therefore, the relative levels presented in Table 1 are illustrative only and are not intended to limit the invention to the specific relationships between the various numbers in the columns.

Table 1 illustrates one embodiment of the encoding of architectural cells S0 and S1 and the corresponding function of reference voltage generator circuit 550. In Table 1, a zero in columns S0 and S1 corresponds to a logic zero and is equivalent to a programmed state, and a one corresponds to a logic one and is equivalent to an unprogrammed or erased state. Of course, as is known to those skilled in the art, alternative definitions of the programmed and unprogrammed states may be used with the principles of this invention to define alternative embodiments.

In the preceding and following discussion, for ease of expression, only programmable architectural cells are described. The cells in these applications may be fuses, EPROM cells, EEPROM cells, RAM cells, or antifuse technology in accordance with the invention.

The architectural cells are a means for providing signals to a programmable reference voltage generator so that the generator drives a desired voltage level on the output line of the generator.

Unlike the prior art block-level granularity methods that traded one level of reduction in power performance for a reduced speed performance and consequently ineffectual power reductions in most applications, the novel multi-level block-level granularity provides a range of power and speed performances trade-offs. High-speed signals can be placed and routed to one programmable logic block 401-i and reference voltage generator 550-i configured for high speed high power performance. Other signals that have an intermediate speed performance requirement can be placed and routed to another programmable logic block 401-j and reference voltage generator 550-j configured for medium fast speed performance and medium high power consumption. Similarly, the slowest speed performance signals can be placed and routed to yet another programmable logic block 401-k and reference voltage generator 550-k configured for slow performance and ultra-low power consumption.

Since it is no longer necessary to combine the slow speed performance signals and the intermediate speed performance signals with a common power level consumption, true savings in power consumption are achieved without comprising the speed performance of the intermediate speed performance signals. Further, the placing and routing is typically straightforward, because the speed performance of the various circuits implemented in the CPLD is known.

In another embodiment, not only is the power/speed performance controlled as described above, but also the speed/power performance of macrocell 530-i is tied to the slew rate of I/O pin 555-i driven by macrocell 530-i. The configuration of programmable logic block 601 (FIG. 6) is the same as that described above for programmable logic block 501 and that description is incorporated herein by reference.

However, in this embodiment, power and speed control circuit 450-i includes a programmable sense/OR reference voltage generator 651 that is connected by a sense reference voltage line 653 to sensing and OR circuitry 520-1 to 520-n, and a programmable slew rate reference voltage generator 652 that is connected by slew rate reference voltage line 654 to each of I/O cells 540-1 to 540-n. Programmable sense/OR reference voltage generator 651 is programmably configured using programmable power/speed reference architectural cells S0 and S1 to provide a voltage level VREFSENSE on reference voltage line 653, where voltage level VREFSENSE is one of at least three reference voltage levels. For each reference voltage level VREFSENSE, programmable logic block 501 has a different speed performance and power consumption.

Programmable slew rate reference voltage generator 652 is programmably configured using programmable power/speed reference architectural cells S0 and S1 to provide a voltage level VREFSLEW on reference voltage line 654, where voltage level VREFSLEW is one of at least two reference voltage levels.

Thus, in this embodiment, programmable power/speed reference architectural cells S0 and S1 are used to programmably configure both programmable sense/OR reference voltage generator 651 and programmable slew rate reference voltage generator 652. Since the number of programmable power/speed reference architectural cells S0 and S1 is unchanged, this embodiment has three power levels: a fast slew rate associated with the highest-speed mode; a slow slew rate associated with the lowest-power mode; and a selectable slew rate, e.g., fast or slow, for the medium speed/power mode Table 2 is one example of the different power/speed points and slew rates for one embodiment of the possible configurations of programmable power/speed reference architectural cells S0 and S1.

TABLE 2

Power/Speed Points with Slew Rate for
Programmable Sense/OR Reference Voltage Generator 651
and
Programmable Slew Rate Reference Voltage Generator 652

| S0 | S1 | VREFSENSE (Volts) | Speed | Power | Slew Rate |
|---|---|---|---|---|---|
| 0 | 0 | High 1.2 | Fast 1 | High 1 | Fast 1 |
| 0 | 1 | Med 1.05 | Med 1.5 | Med 0.5 | Fast 1 |
| 1 | 0 | Med 1.05 | Med 1.5 | Med 0.5 | Slow 0.3 |
| 1 | 1 | Low 0.92 | Slow 2 | Low 0.2 | Slow 0.3 |

All but the last two columns of Table 2 are defined in the same way as the corresponding columns of Table 1. The last two columns are the slew rate associated with each power/speed point.

Providing multiple power levels at a block level granularity allows some signals in the CPLD to have extremely fast speeds, and some signals to be powered down far below what would be possible in the prior art two-level power-down methods including methods with fine granularity control. User implementations requiring low speed therefore operate at power consumption levels far below anything possible in prior-art CPLDs. In one example, a prior-art CPLD with fine granularity control achieves 130 mA of current when all cells are in low power mode; an equivalent device using this invention is expected to draw less than 50 mA of current, cutting the power consumption by over 60%. This invention therefore allows both the offering of power consumption levels more attractive to users for all performance levels, and the development of larger CPLDs than might be possible without the invention.

The particular technique use to implement the power down circuitry on a block level is not an essential feature of this invention and can be implemented in a wide variety of ways by those of skill in the art. For example, the use of a reference voltage level to determine the drive point in a MOS circuit is well-known.

Figure 7A:
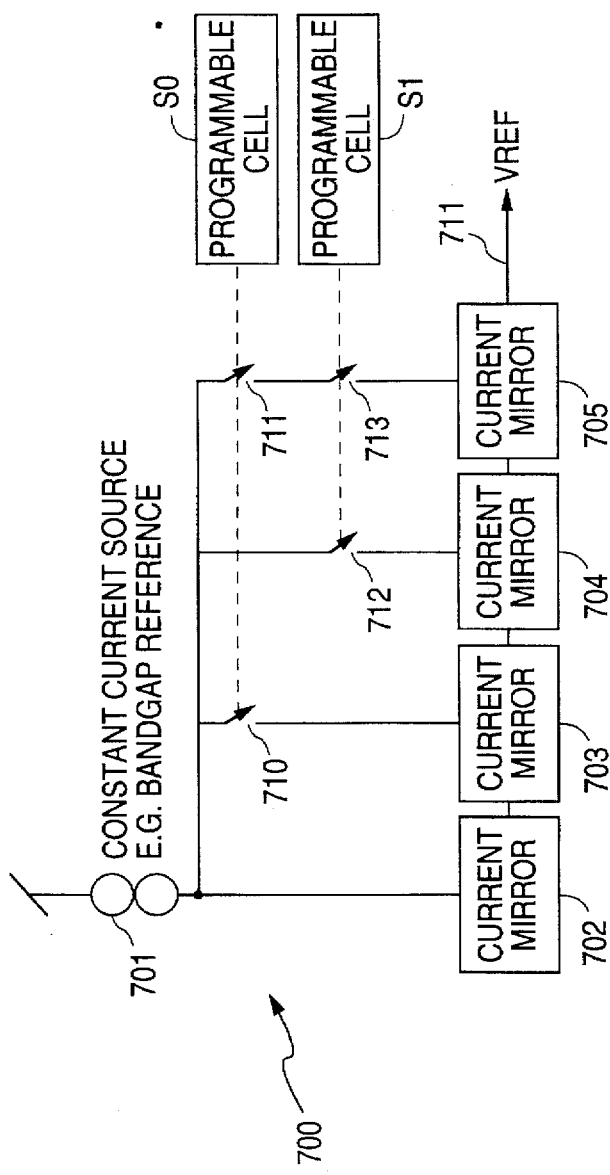
FIG. 7A is a diagram of one embodiment of a block-level reference voltage generator circuit of this invention.

Nevertheless, FIG. 7A is a diagram of one embodiment of a programmable reference voltage generator circuit 700. Programmable reference voltage generator circuit 700 includes a single current source 701, such as a bandgap reference, and a plurality of current mirrors 702 to 705.

Each of current mirrors 702 to 705 is programmably connected to and disconnected from generator circuit 700 to adjust the level of reference voltage Vref on power and speed control output line 711. In this embodiment, the state of programmable power/speed reference architectural cell S0 controls the states of switches 710 and 711, while the state of programmable power/speed reference architectural cell S1 controls the states of switches 712 and 713. The use of switch elements 710 to 713 in FIG. 7A is illustrative only of a function performed in generator circuit 700. Those of skill in the art will appreciate that the switch function can be implemented in a wide variety of ways.

In this embodiment, when cells S0 and S1 are configured to generate a logic zero, all of switches 710 to 713 are open, current mirror 702 is connected to current source 701, and the level of reference voltage Vref on output line 711 is a maximum, i.e., a first level. When cell S0 generates a logic one and cell S1 generates a logic zero, current mirrors 702 and 703 are connected to current source 701, and the level of reference voltage Vref is reduced to a second level that is less than the first level. When cell S1 generates a logic one and cell S0 generates a logic zero, current mirrors 702 and 704 are connected to current source 701, and the level of reference voltage Vref is reduced to a third level that, in this embodiment, is less than the second level. Finally, when cells S0 and S1 are configured to generate a logic one, all of switches 710 to 713 are closed, and so current mirrors 702 to 705 all are connected to current source 701. The level of reference voltage Vref is reduced to a minimum level, i.e., a fourth level. Thus, as additional current mirrors are switched into generator circuit 700, current source 701 is divided up further, and the lower the level of reference voltage Vref on output line 711 becomes.

In an alternative embodiment, rather than use current mirrors to divide up a current source, the programmable reference voltage generator circuit includes a plurality of current sources. The set of current sources are individually programmably connected to and disconnected from the reference voltage output line so as to vary the reference voltage level.

Figure 6:
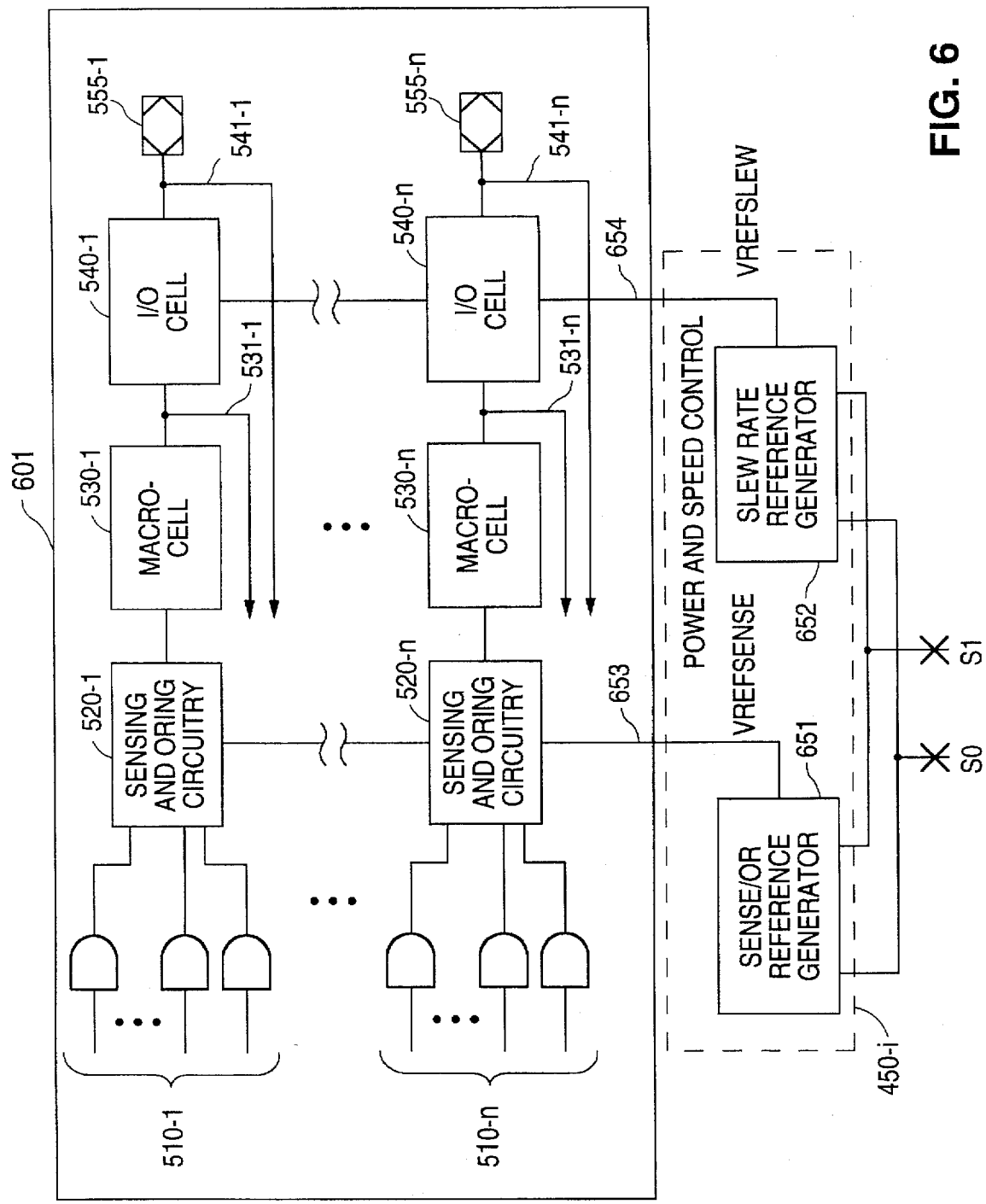
FIG. 6 is a more detailed illustration of one programmable logic block of the CPLD of FIG. 5 that illustrates another embodiment of the novel power-down structure of this invention.
Figure 7B:
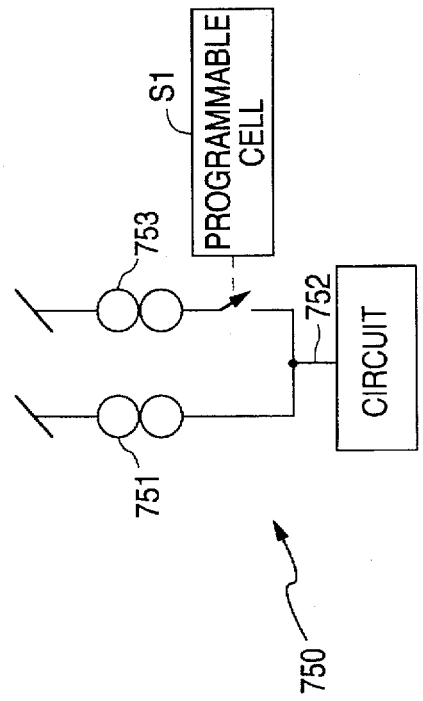
FIG. 7B is a diagram of another embodiment of a block-level reference voltage generator circuit of this invention.

For example, in FIG. 7B, circuit 750 has a first current source 751 that is fixedly connected to output line 752 and provides a minimum reference voltage level. A second current source 753 is programmably connectable to and disconnectable from output line 752 by programmable power/speed reference architectural cell S1. When second current source 752 is connected to output line 752, a second reference voltage level is provided on the line. In the embodiment of FIG. 6, programmable sense/OR reference voltage generator 651 is constructed using a current mirror circuit similar is to that illustrated in FIG. 7A, and programmable slew rate reference voltage generator 652 is constructed using a plurality of current sources as illustrated in FIG. 7B.

The embodiments described of above are illustrative only of the principles of this invention. In view of this disclosure, those of skill in the art can utilize the low granularity multi-level power and speed control circuit in a wide variety of PLD architectures to achieve new levels of both speed performance and power savings.

We claim:

1. A power-down circuit for a programmable logic device comprising:
   a first programmable logic structure including:
      a plurality of logic elements; and
      a power and speed performance control line coupled to each of said plurality of logic elements wherein a speed performance and a power consumption of said first programmable logic structure are determined by a signal on said power and speed performance control line; and
   a first programmable power and speed control circuit connected to said power and speed performance control line wherein said first programmable power and speed control circuit is programmably configurable to provide a signal selected from one of at least three power and speed performance point signals on said power and speed performance control line of said first programmable logic structure.

2. A power-down circuit for a programmable logic device as in claim 1 further comprising:
   a second programmable logic structure including:
      a plurality of logic elements; and
      a power and speed performance control line coupled to each of said plurality of logic elements wherein a speed performance and a power consumption of said second programmable logic structure are determined by a signal on said power and speed performance control line of said second programmable logic structure; and
   a second programmable power and speed control circuit connected to said power and speed performance control line of said second programmable logic structure wherein said second programmable power and speed control circuit is programmably configurable to provide a signal selected from one of at least three power and speed performance point signals on said power and speed performance control line of said second programmable logic structure.

3. A power-down circuit for a programmable logic device as in claim 1 further comprising:
   a first plurality of programmable power/speed reference architectural cells connected to said first programmable power and speed control circuit wherein upon programming said first plurality of programmable power/speed reference architectural cells, said first programmable power and speed control generates said signal on said power and speed performance control line of said first programmable logic structure.

4. A power-down circuit for a programmable logic device as in claim 3 further comprising:
   a second plurality of programmable power/speed reference architectural cells connected to said second programmable power and speed control circuit wherein upon programming said second plurality of programmable power/speed reference architectural cells, said second programmable power and speed control generates said signal on said power and speed performance control line of said second programmable logic structure.

5. A power-down circuit for a programmable logic device as in claim 1 wherein said first programmable power and speed control circuit comprises:

a programmable reference voltage generator circuit coupled to said power and speed performance control line wherein said signal is a voltage level generated by said programmable reference voltage generator circuit.

6. A power-down circuit for a programmable logic device as in claim 2 wherein said second programmable power and speed control circuit comprises:

a programmable reference voltage generator circuit coupled to said power and speed performance control line wherein said signal is a voltage level generated by said programmable reference voltage generator circuit.

7. A programmable logic device as in claim 5 further comprising:

a plurality of programmable power/speed reference architectural cells connected to said programmable reference voltage generator circuit wherein upon programming said plurality of programmable power/speed reference architectural cells, said programmable reference voltage generator circuit drives one of at least three voltage levels on said power and speed control line as said signal.

8. A programmable logic device as in claim 6 further comprising:

a plurality of programmable power/speed reference architectural cells connected to said programmable reference voltage generator circuit wherein upon programming said plurality of programmable power/speed reference architectural cells, said programmable reference voltage generator circuit drives one of at least three voltage levels on said power and speed control line as said signal.

9. A power-down circuit for a programmable logic device as in claim 1 wherein said first programmable power and speed control circuit comprises:

a programmable sense/OR reference voltage generator circuit coupled to said power and speed performance control line wherein said signal is a voltage level generated by said programmable reference voltage generator circuit; and a programmable slew rate reference voltage generator circuit coupled to at least one I/O cell in said first programmable logic block structure.

10. A power and speed control circuit for a programmable logic device having groups of plurality of signal paths comprising:

a plurality of programmable power and speed control circuits wherein each circuit in said plurality of programmable power and speed control circuits has a power and speed control output line coupled to logic elements in one group of said groups of plurality of signal paths; and each circuit in said plurality of programmable power and speed control circuits is programmably configurable to provide any one of at least three signals on said power and speed control output line; and a plurality of sets of programmable power/speed reference architectural cells wherein each set of said plurality of sets of programmable power/speed reference architectural cells is connected to a different one of said plurality of programmable power and speed control circuits and further wherein upon programming a set of said programmable power/speed reference architectural cells, said programmable power and speed control circuit connected to said set drives one of said at least three signals on said power and speed control line.

11. A method for controlling power consumption and speed performance of a programmable logic device having a plurality of programmable logic blocks, said method comprising:

controlling power consumption and speed performance with a block level granularity power and speed control circuit that provides at least three power consumption and speed performance points; and selecting a power consumption and speed performance point for each programmable logic block using the block level granularity power and speed control circuit for that block wherein said speed performance is select based upon a signal speed required for signals in said each programmable logic block.

* * * * *

UNITED STATES PATENT AND TRADEMARK OFFICE
CERTIFICATE OF CORRECTION

PATENT NO.   :   5,751,164
DATED        :   May 12, 1998
INVENTOR(S)  :   Sharpe-Geisler, Bradley A; Moyer, Bryon I.

It is certified that error appears in the above-identified patent and that said Letters Patent is hereby corrected as shown below:

Column 6, Line 45, delete "51" and insert --S1--.

Signed and Sealed this

Sixth Day of October, 1998

*Attest:*

BRUCE LEHMAN

*Attesting Officer*       *Commissioner of Patents and Trademarks*